United States Patent
Sugihara et al.

(10) Patent No.: US 8,601,337 B2
(45) Date of Patent: Dec. 3, 2013

(54) DECODING METHOD AND DECODING DEVICE

(75) Inventors: Kenya Sugihara, Tokyo (JP); Yoshikuni Miyata, Tokyo (JP); Hideo Yoshida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 706 days.

(21) Appl. No.: 12/818,748

(22) Filed: Jun. 18, 2010

(65) Prior Publication Data

US 2010/0325514 A1    Dec. 23, 2010

(30) Foreign Application Priority Data

Jun. 19, 2009  (JP) ................................. 2009-146345

(51) Int. Cl.
*H03M 13/11* (2006.01)
*H03M 13/53* (2006.01)

(52) U.S. Cl.
USPC .......................................... 714/752; 714/804

(58) Field of Classification Search
None
See application file for complete search history.

(56) References Cited

FOREIGN PATENT DOCUMENTS

| EP | 1909395 A1 * | 4/2008 | ............ H03M 13/19 |
|----|----|----|----|
| JP | 2008-541496 A | 11/2008 | |
| WO | WO 2006/123543 A1 | 11/2006 | |
| WO | WO 2007/007801 A1 | 1/2007 | |

OTHER PUBLICATIONS

Chen, Jinghu et al. "Reduced-Complexity Decoding of LDPC Codes", IEEE Transactions on Communications, vol. 53, No. 8, Aug. 2005, pp. 1288-1299.
Sakai, Lui et al. "Reduced Complexity Decoding Based on Approximation of Update Function for Low-Density Parity Check Codes", The Transactions of the Institute of Electronics, Information and Communication Engineers, A, vol. J90-A, No. 2, pp. 83-91, 2007.
Degree-Matched Check Node Decoding for Regular and Irregular LDPCs, Sheryl L. Howard, Student Member, IEEE, Christian Schlegel, Senior Member IEEE, and Vincent C. Gaudet, member, IEEE, Oct. 2006.
Low-Complexity Decoding of LDPC Codes N. Pandya and B. Honary, Electronics Letters, Aug. 31, 2007, vol. 43, No. 18.
Low-Complexity Decoding of LDPC Codes, N. Pandya and B. Honary, Electronics Letters, Aug. 31, 2007, Vo. 43, No. 18.
Modified Min-sum Decoding Algorithm for LDPC Codes Based on Classified Correction, Zhou Zhong et al., State Key Laboratory on Microwave and Digital Communications, National Laboratory for Information Science and Technology, Dept. of Electronic Engineering, Tsinghua University, Beijing, China, National Digital Switching System Engineering & Technology Research Center, Zhengzhou, China, Aug. 25, 2008.
On Implementation of Min-Sum Algorithm and Its Modifications for Decoding Low-Density Parity-Check (LDPC) Codes, Jianguang Zhao, Farhad Zarkeshvari, Student Member, IEEE, and Amir H. Banihashemi, Member, IEEE, IEEE Transactions on Communications, vol. 53, No. 4, Apr. 2005.

* cited by examiner

*Primary Examiner* — Ajay Bhatia
*Assistant Examiner* — Dipakkumar Gandhi
(74) *Attorney, Agent, or Firm* — Birch, Stewart, Kolasch & Birch, LLP

(57) ABSTRACT

In row calculation, a value which is obtained by subtracting an offset according to a minimum of the absolute values of column LLRs from the minimum of the absolute values of the column LLRs is set as a row LLR corresponding to a column of the column LLRs.

8 Claims, 9 Drawing Sheets

DECODING METHOD AND DECODING DEVICE

BACKGROUND OF THE INVENTION

1. Field of the Invention

The present invention relates to a decoding method of and a decoding device for decoding an error correcting code.

2. Description of Related Art

A low-density parity-check code (referred to as an LDPC code from here on) is an error correcting code defined by an m×n matrix in which 1s are scattered. This matrix is referred to as a check matrix. A Sum-Product decoding method was devised as a decoding method of decoding an LDPC code in the 1960s. However, while the Sum-Product decoding method has a high decoding performance, the Sum-Product decoding method requires a large amount of arithmetic operations and it is difficult to implement a circuit for the Sum-Product decoding method. In contrast with this, an Offset BP-based decoding method described in nonpatent reference 1 reduces the amount of arithmetic operations greatly by carrying out calculations approximate to that based on the Sum-Product decoding method.

First, concrete arithmetic operations carried out according to the Sum-Product decoding method will be explained. The algorithm of this decoding method consists of two arithmetic operations which are referred to as a row arithmetic operation and a column arithmetic operation, and decoding is carried out by repeating these arithmetic operations alternately according to the algorithm. The row arithmetic operation is performed on each row of the check matrix. A set of the numbers of columns in each of which the element is equal to 1 in the r-th row of the check matrix is expressed as N(r). For each column c whose number is included in N(r), a row log-likelihood ratio (referred to as an LLR from here on) $\epsilon_{r,c}$ is calculated according to the following equation (1).

$$\varepsilon_{r,c} = \left( \prod_{c' \in N(r)/\{c\}} \mathrm{sgn}(z_{r,c'}) \right) \cdot \left( \bigotimes_{c' \in N(r)\setminus\{c\}} |z_{r,c'}| \right) \quad (1)$$

$z_{r,c}$ is a column LLR calculated through the column arithmetic operation which will be explained below, and $\lambda_c$ which is an LLR which is calculated for each bit from the received sequence is stored as $z_{r,c}$ during the first iteration of the row arithmetic operation. c' shows a column other than the column c, having a column number included in N(r).

The definitions of symbols of operation in the above-mentioned equation (1) are as shown in the following equations (2) to (5).

$$\mathrm{sgn}(x) = \begin{cases} 1 & (x \geq 0) \\ -1 & (x < 0) \end{cases} \quad (2)$$

$$\bigotimes_{i \in I} z_i = z_1 \otimes z_2 \otimes \ldots \otimes z_{|I|} \quad (I = \{1, 2, \ldots, |I|\}) \quad (3)$$

$$x \otimes y = f(f(x) + f(y)) \quad (4)$$

$$f(x) = \ln \frac{\exp(x)+1}{\exp(x)-1} \quad (5)$$

Next, the column arithmetic operation will be explained. A column LLR $z_{r,c}$ is calculated from the row LLR $\epsilon_{r,c}$ determined through the row arithmetic operation by using the following equation (6).

$$z_{r,c} = \lambda_c + \sum_{r' \in M(c)\setminus\{r\}} \varepsilon_{r',c} \quad (6)$$

$\lambda_c$ is the above-mentioned LLR. A set of the numbers of rows in each of which the element is equal to 1 in the c-th column of the check matrix is expressed as M(c). r' shows a row other than the row r, having a row number included in M(c).

An estimation of the transmission bits is carried out by using the following equation (7).

$$z_c = \lambda_c + \sum_{r \in M(c)} \varepsilon_{r,c} \quad (7)$$

When $z_c$ is zero or more in the result of an arithmetic operation according to the above equation (7), it is estimated that the c-th bit of the received sequence is 1, whereas when $z_c$ is smaller than zero, it is estimated that the c-th bit of the received sequence is 0.

Whether or not the estimated bit sequence is a codeword can be determined by using a parity check. Unless the estimated bit sequence is a codeword, the row arithmetic operation is carried out by using the column LLRs calculated through the column arithmetic operation, and, after that, the arithmetic operations explained until now are redone. When the number of times that the arithmetic operations have been iterated reaches its upper limit or when the estimated bit sequence is a codeword, the estimated bit sequence is outputted and the decoding is ended. In the Sum-Product decoding method, the row arithmetic operation shown by the above-mentioned equation (1) requires a huge amount of arithmetic operations.

In accordance with the Offset BP-based decoding method disclosed in nonpatent reference 1, a row arithmetic operation according to the following equation (8) is carried out on instead of that according to the above-mentioned equation (1).

$$\varepsilon_{r,c} = \left( \prod_{c' \in N(r)\setminus\{c\}} \mathrm{sgn}(z_{r,c'}) \right) \cdot \max\left\{ \min_{c' \in N(r)\setminus\{c\}} \{|z_{r,c'}|\} - \alpha, 0 \right\} \quad (8)$$

An offset $\alpha$ is a constant calculated for each check matrix, and $\alpha$ providing the highest decoding performance is calculated by using a density evolution method. In accordance with the Offset BP-based decoding method, what is necessary is just to determine a minimum and subtract the offset $\alpha$ from the minimum, and the amount of arithmetic operations of the row arithmetic operation can be reduced greatly.

Although it is already said that the Offset BP-based decoding method include arithmetic operations approximate to those of the Sum-Product decoding method, the approximate arithmetic operations will be explained below in more detail. It is known that a dyadic (or binary) operation defined by the above-mentioned equation (4) which appears in the row arithmetic operation is equivalent to the following equation (9).

$$x \otimes y = \min\{x,y\} - \ln(1+\exp(-|x-y|)) + \ln(1+\exp(-(x+y))) \quad (9)$$

In accordance with the Offset BP-based decoding method, a logarithmic function of the second and subsequent terms of the above-mentioned equation (9) is acquired by approximating the logarithmic function by the constant $\alpha$. In the above-mentioned equation (1) for use in the row arithmetic operation based on the Sum-Product decoding method, a recursive operation (i.e., an arithmetic operation shown by the above-mentioned equation (3)) is included, the approximation calculation including the influence of this recursive operation into the constant α is shown by the above-mentioned equation (8) for use in the row arithmetic operation based on the Offset BP-based decoding method.

[Nonpatent reference 1] J. Chen, A. Dholakia, E. Eleftheriou, M. P. C. Fossorier, and X.-Y. Hu, "Reduced-Complexity Decoding of LDPC Codes", IEEE Trans. Communications, vol. 53, issue 8, pp. 1288-1299, August 2005.

As mentioned above, in accordance with the Offset BP-based decoding method, the logarithmic function and the influence of the recursive operation are approximated by the constant α. However, actual numerical values which are calculated in accordance with the Sum-Product decoding method change largely and dependently upon variables in the row arithmetic operation. Therefore, a problem with the Offset BP-based decoding method is that the precision of the approximate calculation is low and the decoding performance is not adequate.

SUMMARY OF THE INVENTION

The present invention is made in order to solve the above-mentioned problem, and it is therefore an object of the present invention to provide a decoding method and a decoding device that can approximate a row arithmetic operation based on a Sum-Product decoding method with a high degree of precision by using an Offset BP-based decoding method, thereby improving the performance of decoding of an error correcting code.

In accordance with the present invention, there is provided a decoding method including: a row calculating step of calculating row LLRs corresponding to a row weight of a check matrix of an LDPC code; a column calculating step of calculating column LLRs corresponding to a column weight of the check matrix from the row LLRs; a bit estimating step of calculating an estimated bit sequence by estimating each bit on a basis of the column LLRs; and a checking step of checking whether or not the estimated bit sequence is the codeword, in which when the row calculating step and the column calculating step are iterated alternately to decode the codeword, in the row calculating step, a value which is obtained by subtracting an offset according to a minimum of absolute values of the column LLRs from the minimum of the absolute values of the column LLRs is set as a row LLR corresponding to a column of the column LLRs.

According to the present invention, in the row calculation, the value which is obtained by subtracting the offset according to the minimum of the absolute values of the column LLRs from the minimum of the absolute values of the column LLRs is set as a row LLR corresponding to a column of the column LLRs. As a result, the present invention provides an advantage of being able to implement a row arithmetic operation approximate (i.e., closely analogous) to that based on the Sum-Product decoding method with a higher degree of precision as compared with the case of using the Offset BP-based decoding method, and improve the performance of decoding an error correcting code.

Further objects and advantages of the present invention will be apparent from the following description of the preferred embodiments of the invention as illustrated in the accompanying drawings.

DETAILED DESCRIPTION OF THE PREFERRED EMBODIMENTS

Figure 1:
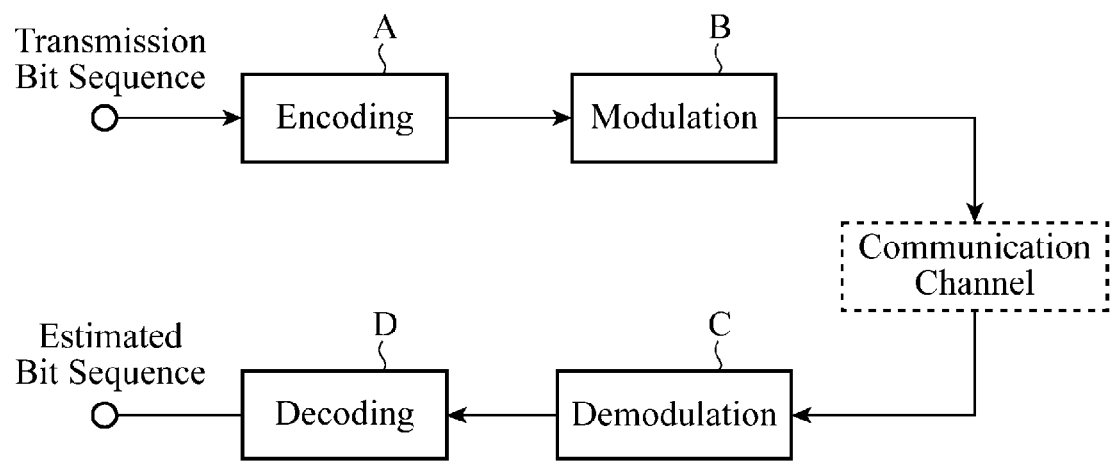
FIG. 1 is a diagram schematically showing a digital communications process using error correcting codes.

The preferred embodiments of the present invention will be now described with reference to the accompanying drawings. In the following description of the preferred embodiments, like reference numerals refer to like elements in the various views.

Embodiment 1

FIG. 1 is a diagram schematically showing a digital communications process using error correcting codes. As shown in FIG. 1, in digital communications, a transmission bit sequence is encoded first to generate a codeword (step A). Next, the encoded bit sequence is modulated (step B). When receiving the modulated signal transmitted thereto via a communication channel, a receive side demodulates the modulated signal to convert the modulated signal into a received signal value (step C). Finally, the receive side carries out decoding using soft decision on the basis of the received signal value to acquire an estimated bit sequence (step D). In accordance with the present invention, the encoding is carried out by using a low-density parity-check code (an LDPC code).

Figure 2:
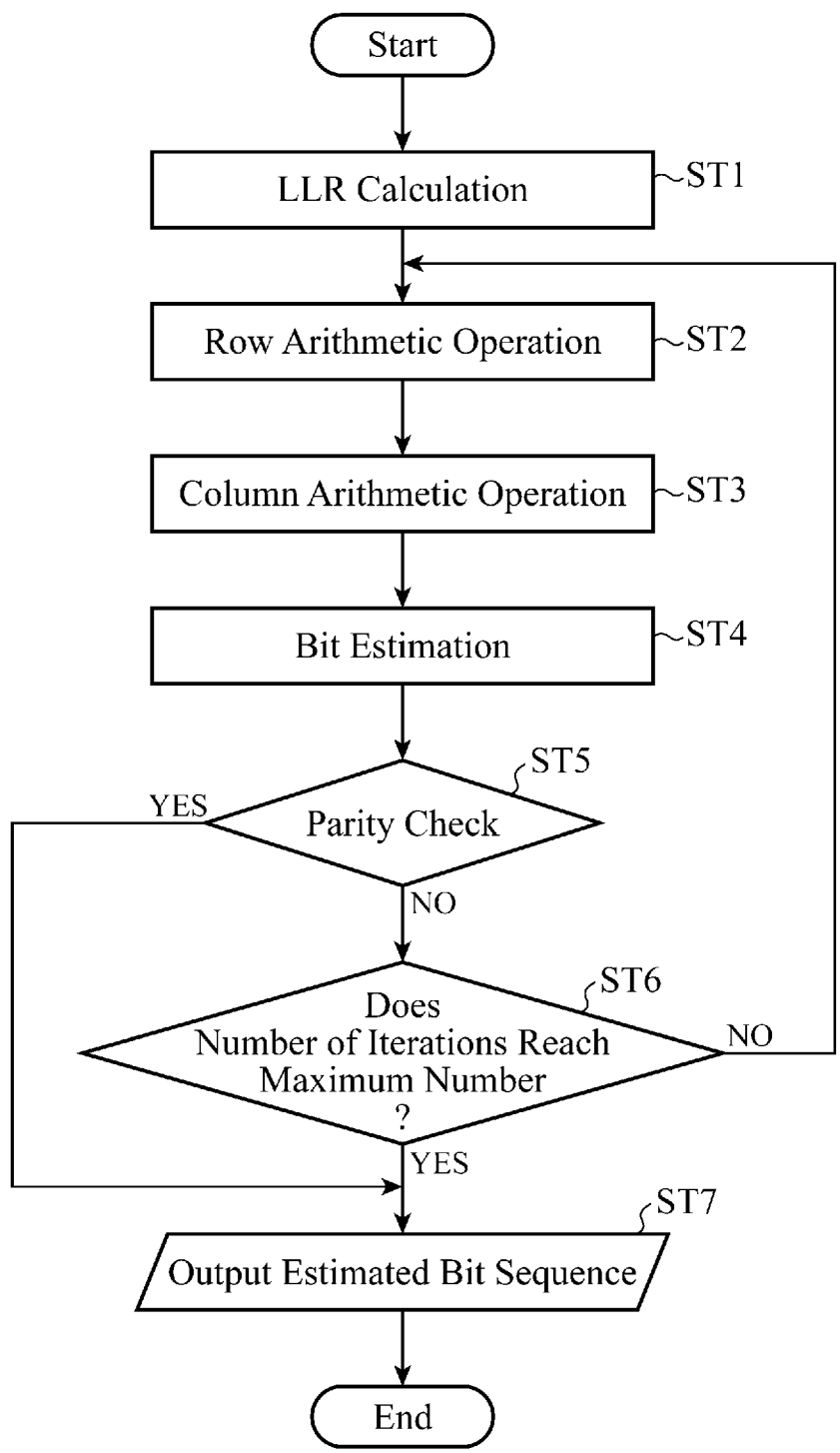
FIG. 2 is a flowchart showing a flow of an error correction decoding method in accordance with Embodiment 1 of the present invention.

FIG. 2 is a flowchart showing a flow of an error correction decoding method in accordance with Embodiment 1 of the present invention. First, from the received signal value of each of bits having the codeword length, the received signal value being acquired through the demodulation of step C shown in FIG. 1, an LLR is calculated for each of the bits (step ST1). Next, row LLRs are calculated by using the LLRs acquired in step ST1 (step ST2), and column LLRs are calculated from these row LLRs (step ST3).

Next, an estimation of each of the bits is carried out on the basis of the column LLRs acquired in step ST3, and an estimated bit sequence is calculated (step ST4). After that, whether or not the estimated bit sequence is a codeword is determined (step ST5). At this time, when the estimated bit sequence is a codeword (when YES in step ST5), this estimated bit sequence is outputted (step ST7), and the processing is ended.

Furthermore, when it is determined that the estimated bit sequence is not a codeword (when NO in step ST5), whether the number of times that the processing including the row arithmetic operation and the subsequent operations has been iterated reaches its maximum iteration number is determined (step ST6). At this time, when the number of times that the processing including the row arithmetic operation and the subsequent operations has been iterated reaches its maximum iteration number (when YES in step ST6), the decoding method makes a transition to step ST7, outputs the estimated bit sequence, and ends the processing.

In contrast, when the number of times that the process including the row arithmetic operation and the subsequent operations has been iterated does not reach its maximum iteration number (when NO in step ST6), the decoding method returns to the row arithmetic operation process of step ST2 and then iterates the processing including the row arithmetic operation and the subsequent operations. During the second or later iteration of the row arithmetic operation, the row arithmetic operation is carried out on the basis of the column LLRs calculated through the immediately preceding column arithmetic operation.

Next, the details of the row arithmetic operation in accordance with this Embodiment 1 will be explained. By assuming x=min{x, y} and δ=y-x, the above-mentioned equation (4) can be converted into the following equation (10) through a substitution operation.

$$x \otimes y = \min\{x, y\} - \ln(1 + \exp(-|x - y|)) + \ln(1 + \exp(-(x + y))) \quad (10)$$
$$= \min\{x, y\} - \ln(1 + \exp(-\delta)) + \ln(1 + \exp(-(\delta + 2x)))$$

In addition, the second and third terms of the above-mentioned equation (10) are expressed as g (x, δ), as shown in the following equation (11).

$$g(x,\delta) = -\ln(1+\exp(-\delta)) + \ln(1+\exp(-(\delta+2x))) \quad (11)$$

Figure 3:
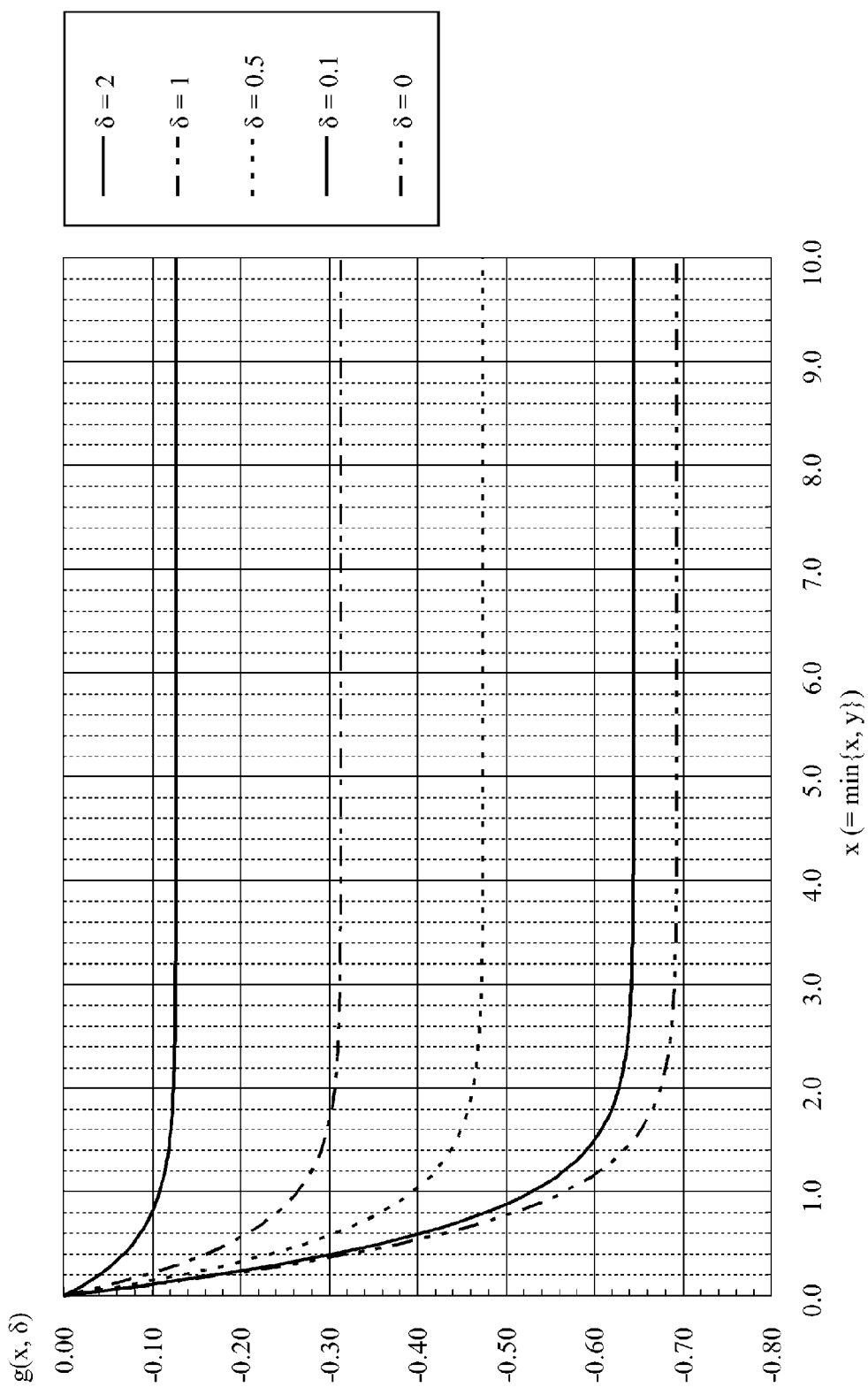
FIG. 3 is a graph showing a relationship between $g(x,\delta)$ and x.

FIG. 3 is a graph showing a relationship between g (x, δ), which is calculated according to the above-mentioned equation (11), and x, and the horizontal axis shows x and the vertical axis shows g (x,δ). In FIG. 3, the results of calculations of g(x, δ) using the above-mentioned equation (11) in a case in which δ is set to each of the following fixed values: 2, 1, 0.5, 0.1, and 0. In accordance with the Offset BP-based decoding method, g (x,δ) is approximated by a constant value as mentioned above, though, as can be seen from the graph shown in FIG. 3, when x is close to 0, g(x,δ) also has a value close to 0 regardless of the value of δ.

Therefore, in accordance with this Embodiment 1, when x is smaller than a constant γ, g(x,δ) is approximated to be 0, whereas when x is larger than γ, g(x,δ) is approximated to be a constant, like in the case of using the Offset BP-based decoding method. In the above explanation, the approximation in the above-mentioned equation (4) is shown. Alternatively, by taking into consideration the influence of the recursive operation according to the above-mentioned equation (1) (i.e., the arithmetic operation according to the above-mentioned equation (3)), an approximate calculation of subtracting a constant offset β from a minimum of $|z_{r,c'}|$ can be carried out only when the minimum of $|z_{r,c'}|$ is equal to or larger than γ. By formulating this approximate calculation, the following equation (12) is provided.

$$\varepsilon_{r,c} = \begin{cases} sg_{r,c} \cdot \max\left\{\min_{c' \in N(r)\backslash\{c\}} \{|z_{r,c'}|\} - \beta, 0\right\} & \text{if } \min_{c' \in N(r)\backslash\{c\}} \{|z_{r,c'}|\} \geq \gamma \\ sg_{r,c} \cdot \min_{c' \in N(r)\backslash\{c\}} \{|z_{r,c'}|\} & \text{if } \min_{c' \in N(r)\backslash\{c\}} \{|z_{r,c'}|\} < \gamma \end{cases} \quad (12)$$

$sg_{r,c}$ in the above equation (12) is expressed by the following equation (13).

$$sg_{r,c} = \prod_{c' \in N(r)\backslash\{c\}} \text{sgn}(z_{r,c'}) \quad (13)$$

The constants β and γ have different values depending upon the check matrix. Furthermore, the values of these constants can be determined by using a density evolution method, a decoding simulation, or another means in such a way that the decoding performance is maximized, and the constants are preset to the values respectively.

Figure 4:
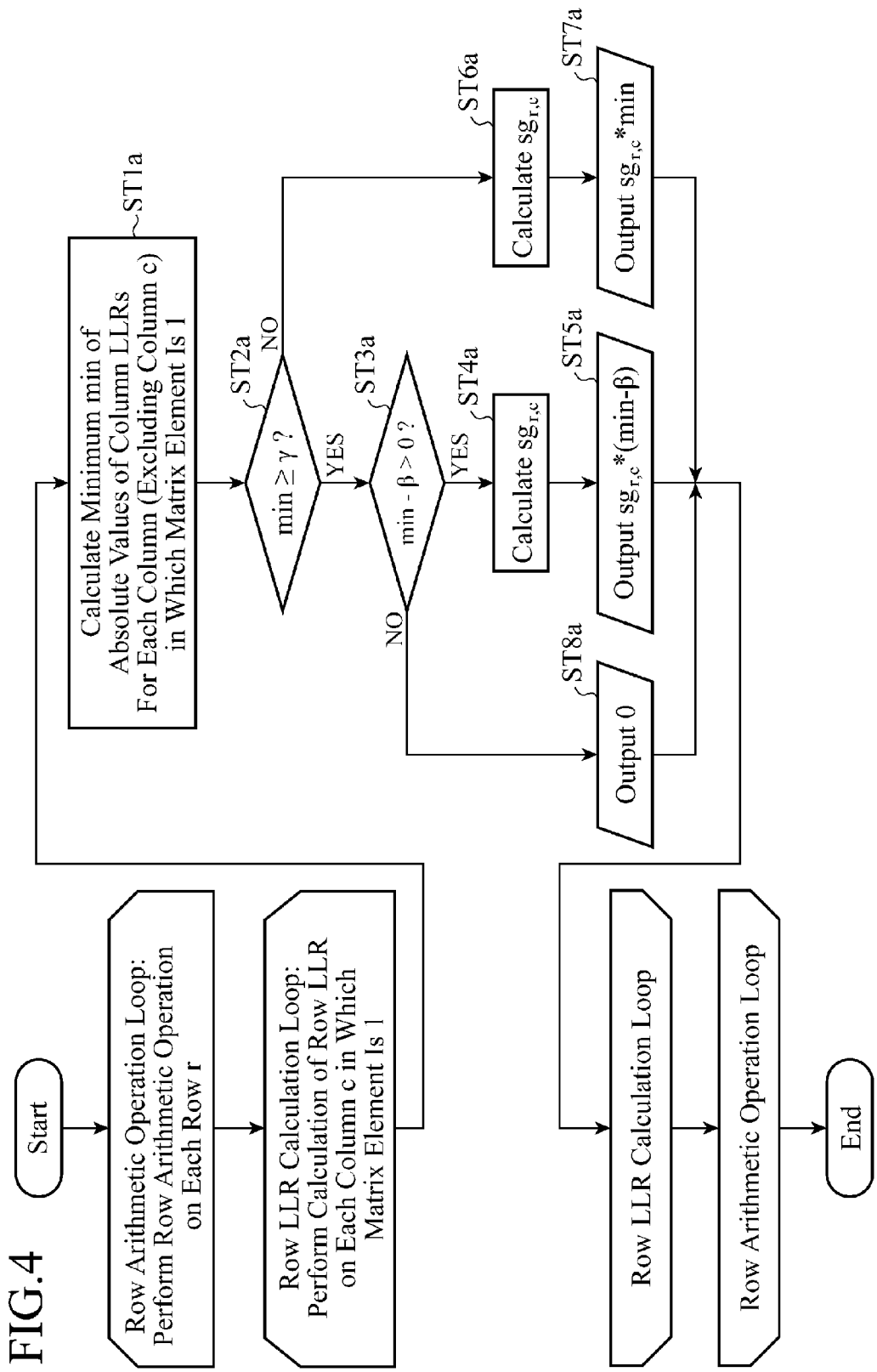
FIG. 4 is a flow chart showing an example of a row arithmetic operation in accordance with Embodiment 1.

Next, the row arithmetic operation according to the above-mentioned equation (12) will be explained. FIG. 4 is a flow chart showing an example of the row arithmetic operation in accordance with Embodiment 1, and shows the row arithmetic operation according to the above-mentioned equation (12). The row arithmetic operation is carried out for each row, and an outside row arithmetic operation loop shown in the figure shows the row arithmetic operation. Furthermore, for each column of the check matrix in which the matrix element is equal to 1, a row LLR is calculated through the row arithmetic operation. An inside row LLR calculation loop shows this calculation. Hereafter, an arithmetic method of calculating the row LLR for each column c in the row arithmetic operation on the r-th row will be shown.

First, the minimum of the absolute values of the column LLRs for columns (excluding the column c) in the r-th row in each of which the matrix element is equal to 1 is determined (step ST1*a*). This value is expressed as the minimum min. Next, whether or not the minimum min is equal to or larger than γ is determined (step ST2*a*). When it is determined that the minimum min is equal to or larger than γ (when YES in step ST2*a*), the method makes a transition to a process of step ST3*a* and whether or not (min–β), which is obtained by subtracting the constant β from the minimum min, is larger than zero is then determined.

When (min–β) is larger than zero (when YES in step ST3*a*), $sg_{r,c}$ is calculated according to the above-mentioned equation (13) (step ST4*a*). After that, $sg_{r,c}$ E (min–β), which is a value obtained by multiplying $sg_{r,c}$ calculated in step ST4*ac* by (min–β), is outputted (step ST5*a*).

In contrast, when the minimum min is smaller than γ (when NO in step ST2*a*), $sg_{r,c}$ is calculated according to the above-mentioned equation (13) (step ST6*a*), like in the case of step ST4*a*. After that, $sg_{r,c}$·min, which is a value obtained by multiplying $sg_{r,c}$ by the minimum min, is outputted (step ST7*a*).

Furthermore, when (min–β) is zero or less (when NO in step ST3*a*), zero is outputted (step ST8*a*). Although up to this process is included in the row arithmetic operation in accordance with Embodiment 1, this embodiment is not limited to the above-mentioned arithmetic operation as long as the results of the row arithmetic operation are equivalent to the above-mentioned equation (12). For example, commonality can be achieved between step ST4*a* and step ST6*a*, and these steps can be carried out before step ST2*a*. Furthermore, when γ≥β, step ST3*a* and step ST8*a* are unnecessary, and it is not necessary to carry out these steps.

By configuring the decoding method in this way, a row arithmetic operation approximate (i.e., closely analogous) to that based on the Sum-Product decoding method can be implemented with a high degree of precision, and the performance of decoding an error correcting code can be improved. Furthermore, as compared with the case of using the Offset BP-based decoding method with a small amount of arithmetic operations, the decoding method according to this embodiment provides the nearly same amount of arithmetic operations which is only slightly larger than that of the Offset BP-based decoding method by an amount corresponding to one-time comparison, and the amount of arithmetic operations can be reduced remarkably as compared with the Sum-Product decoding method.

Figure 5:
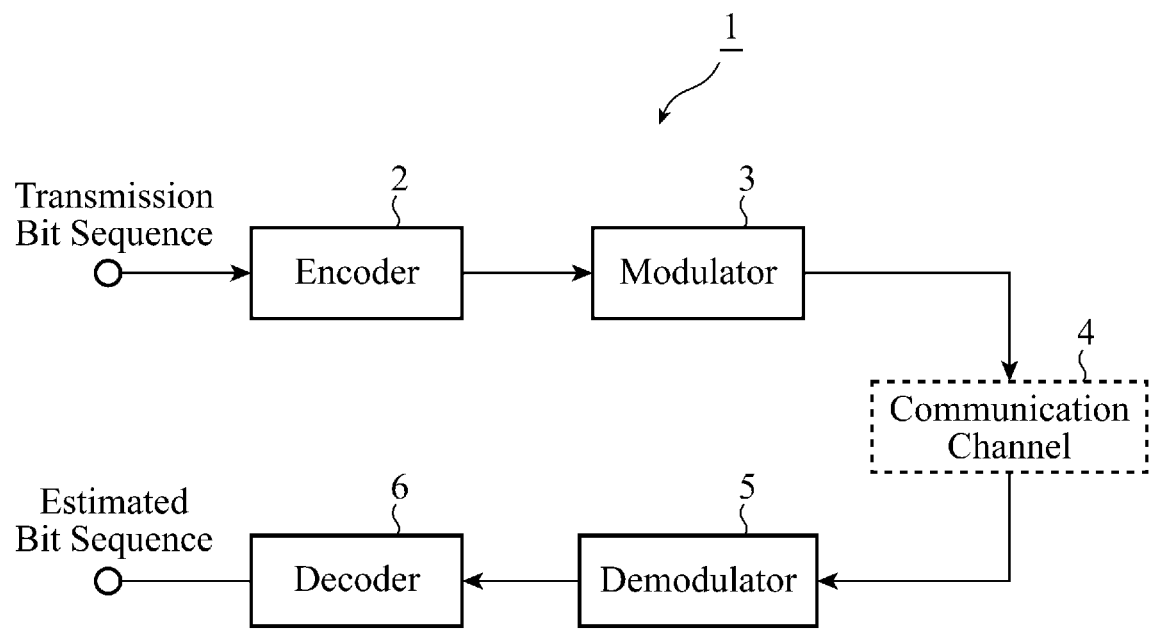
FIG. 5 is a block diagram showing the configuration of a digital communication system in accordance with Embodiment 1.

Next, a system that carries out error correction encoding and decoding by using the above-mentioned error correction decoding method, and a decoder that carries out the above-mentioned error correction decoding will be explained. FIG. 5 is a block diagram showing the configuration of the digital communication system in accordance with Embodiment 1. In FIG. 5, the digital communication system 1 in accordance with Embodiment 1 is provided with an encoder 2 and a modulator 3, as the configuration of a transmit side, and a demodulator 5 and the decoder 6, as the configuration of a receive side. The encoder 2 encodes a transmission bit sequence inputted thereto to generate a codeword. The modulator 3 converts the bit sequence encoded by the encoder 2 into a modulated signal, and transmits the modulated signal to a communication channel 4. In the receive side, the demodulator 5 demodulates the signal received via the communication channel 4 to acquire received signal values. The decoder 6 estimates and outputs an estimated bit sequence from the received signal values of bits having a codeword length which are acquired by the demodulator 5.

Figure 6:
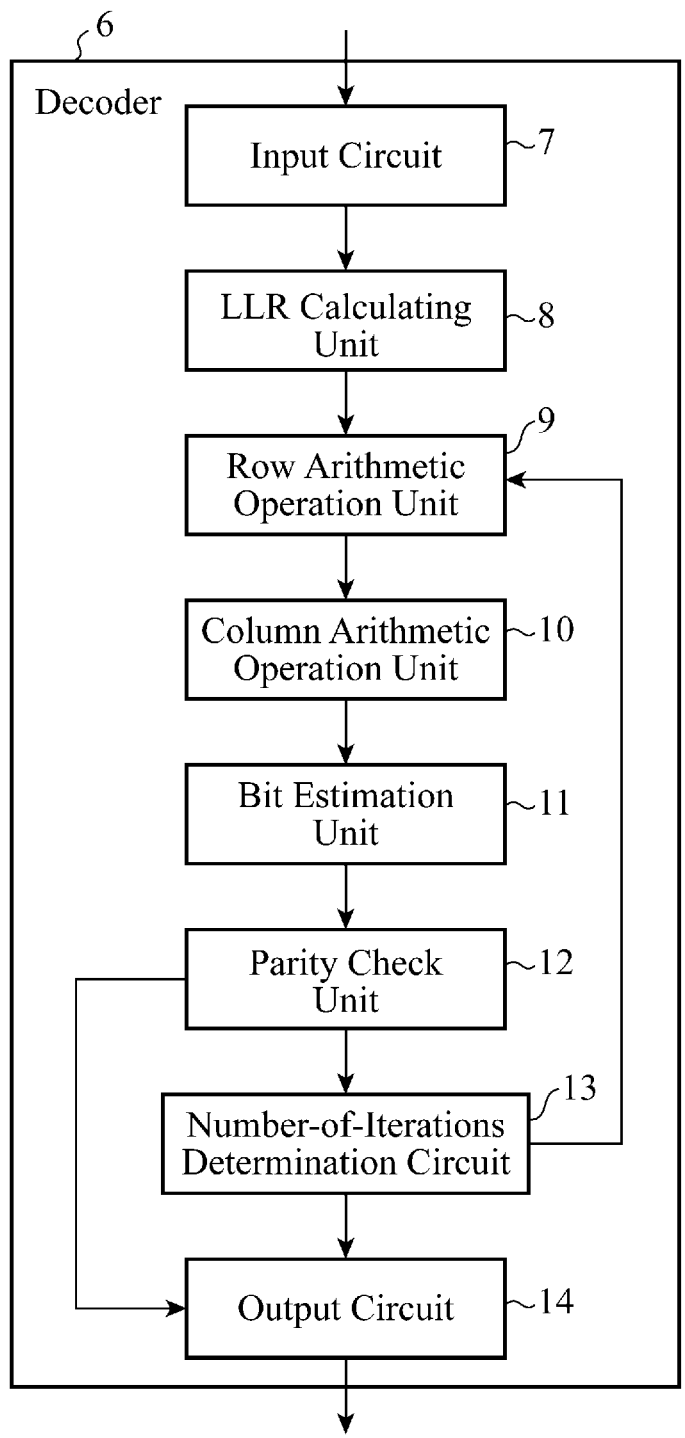
FIG. 6 is a block diagram showing the configuration of a decoder of FIG. 5.

FIG. 6 is a block diagram showing the configuration of the decoder of FIG. 5. As shown in FIG. 6, the decoder 6 is provided with an input circuit 7, an LLR calculating unit 8, a row arithmetic operation unit (a row arithmetic operation means) 9, a column arithmetic operation unit (a column arithmetic operation means) 10, a bit estimation unit (a bit estimation means) 11, a parity check unit (a checking means) 12, a number-of-iterations determination circuit 13, and an output circuit 14. The components are connected in series, as shown in FIG. 6, and the parity check unit 12 is also connected to the output circuit 14 and the number-of-iterations determination circuit 13 is also connected to the row arithmetic operation unit 9.

The configuration of FIG. 6 is an example, and the decoder can have another configuration. In accordance with the present invention, the row arithmetic operation unit 9 has a featured internal structure, and no limitations are imposed on the other configuration of the decoder. For example, the column arithmetic operation unit 10 and the bit estimation unit 11 (and the parity check unit 12) can be connected in parallel, and the number-of-iterations determination circuit 13 can be arranged before the parity check unit 12.

Furthermore, the decoder 6 carries out the decoding process as shown in the flow chart shown in FIG. 2. In the decoder 6, when receiving the received signal values acquired through the demodulation process carried out by the demodulator 5, the input circuit 7 divides the inputted received signal values into blocks each corresponding to a codeword, and outputs the blocks to the LLR calculating unit 8 at appropriate timing. The LLR calculating unit 8 calculates each LLR from the received signal value of each of bits having a codeword length (in step ST1 of FIG. 2).

The row arithmetic operation unit 9 calculates row LLRs by using the LLRs calculated by the LLR computing unit 8 (in step ST2 of FIG. 2). When taking up the baton from the number-of-iterations determination circuit 13, the row arithmetic operation unit 9 calculates row LLRs by using the latest column LLRs calculated by the column arithmetic operation unit 10. The column arithmetic operation unit 10 calculates column LLRs from the row LLRs calculated by the row arithmetic operation unit 9 (in step ST3 of FIG. 2).

The bit estimation unit 11 calculates an estimated bit sequence from the column LLRs calculated by the column arithmetic operation unit 10 (in step ST4 of FIG. 2). The parity check unit 12 makes a parity check of the estimated bit sequence calculated by the bit estimation unit 11 (in step ST5 of FIG. 2), and, when the estimated bit sequence is a codeword, sends the estimated bit sequence to the output circuit 14. In contrast, when the estimated bit sequence is not a codeword, the parity check unit notifies the number-of-iterations determination circuit 13 that the estimated bit sequence is not a codeword.

The number-of-iterations determination circuit 13 counts the number of times that the row arithmetic operation (or the column arithmetic operation) has been iterated for each codeword, and, when receiving the above-mentioned notification from the parity check unit 12, determines whether the number of times that the row arithmetic operation (or the column arithmetic operation) has been iterated reaches a predetermined number of iterations (in step ST6 of FIG. 2). When the number of times that the row arithmetic operation (or the column arithmetic operation) has been iterated reaches the predetermined number of iterations, the number-of-iterations determination circuit 13 sends the estimated bit sequence to the output circuit 14. In contrast, when the number of times that the row arithmetic operation (or the column arithmetic operation) has been iterated does not reach the predetermined number of iterations, the number-of-iterations determination circuit passes the baton to the row arithmetic operation unit 9. The output circuit 14 outputs the estimated bit sequence produced as mentioned above as the output of the decoder 6 (in step ST7 of FIG. 2).

Figure 7:
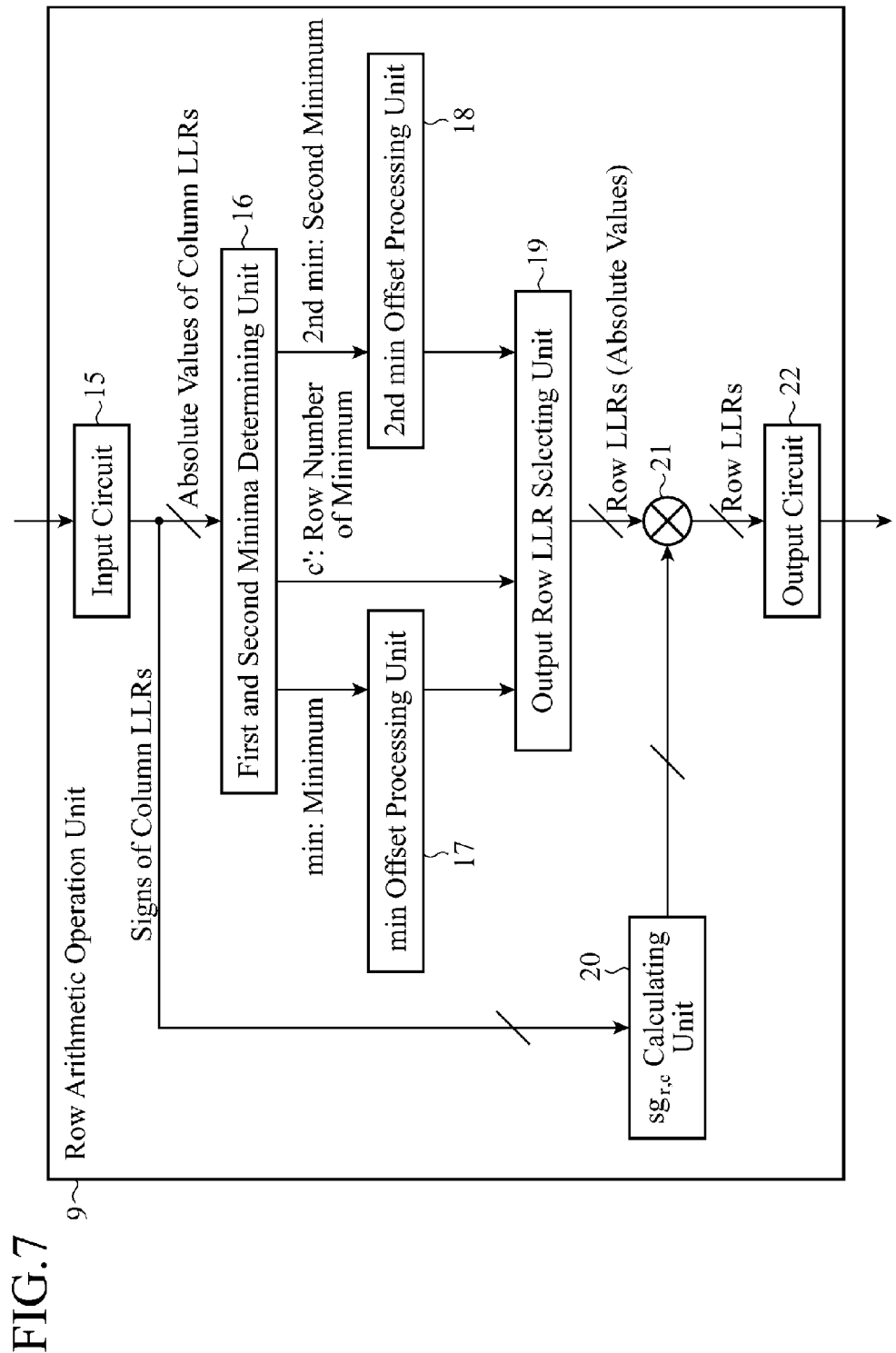
FIG. 7 is a block diagram showing the configuration of a row arithmetic operation unit of FIG. 6.

FIG. 7 is a block diagram showing the configuration of the row arithmetic operation unit of FIG. 6. As shown in FIG. 7, the row arithmetic operation unit 9 in accordance with Embodiment 1 is provided with an input circuit 15, a first and second minima determining unit 16, a min offset processing unit 17, a 2nd min offset processing unit 18, an output row LLR selecting unit 19, an $sg_{r,c}$ calculating unit 20, a multiplication circuit 21, and an output circuit 22. The input circuit 15 is a circuit through which input data to the row arithmetic operation unit 9 passes first. The output circuit 22 is connected to the output of the row arithmetic operation unit 9.

The row arithmetic operation unit 9 carries out the row arithmetic operation corresponding to the flow shown in the flow chart of FIG. 4. In the configuration of FIG. 7, the row arithmetic operation unit carries out the row arithmetic operation on a row-by-row basis and calculates row LLRs to be outputted from each row to each column at one time. First, the input circuit 15 outputs the column LLRs for all columns, in the corresponding row of the check matrix, in each of which the matrix element is equal to 1. From the absolute values of the column LLRs inputted from the input circuit 15, the first and second minima determining unit 16 determines and outputs the minimum min of the absolute values, the row number c' of the column LLR whose absolute value is the minimum, and 2nd min which is the second minimum of the absolute values (in step ST1a of FIG. 4).

The min offset processing unit 17 determines whether or not the minimum min is equal to or larger than γ (in step ST2a of FIG. 4), and, when the minimum min is smaller than γ, outputs the minimum min to the output row LLR selecting unit 19 juts as it is. In contrast, when the minimum min is equal to or larger than γ, the min offset processing unit 17 determines whether or not (min−β) is larger than zero (in step ST3a of FIG. 4). When (min−β) is larger than zero, the min offset processing unit 17 outputs (min−β) to the output row LLR selecting unit 19. In contrast, when (min−β) is equal to or smaller than zero, the min offset processing unit 17 outputs zero to the output row LLR selecting unit 19. The 2nd min offset processing unit 18 carries out an operation similar to that of the min offset processing unit 17.

The output row LLR selecting unit 19 selects (2nd min−β) which is the value on which the offset process has been performed by the 2nd min offset processing unit 18 for the row LLR corresponding to the column c', and selects (min−β) which is the value on which the offset process has been performed by the min offset processing unit 17 for any of the other columns to output the selected value.

The $sg_{r,c}$ calculating unit 20 receives the signs of the column LLRs from the input circuit 15, and carries out an arithmetic operation of calculating $sg_{r,c}$ for each of the columns by using the above-mentioned equation (13) (in steps ST4a and ST6a of FIG. 4). The multiplication circuit 21 carries out multiplication of the absolute value of the row LLR and $sg_{r,c}$ (=+1 or −1) for each of the columns (in steps ST5a and ST7a of FIG. 4) to determine whether the row LLR is positive or negative. The output circuit 22 carries out output control of the row LLRs which are the results of the operation carried out by the multiplication circuit 21.

The row arithmetic operation unit 9 in accordance with this Embodiment 1 is not limited to the circuit structure shown in FIG. 7. For example, the row arithmetic operation unit 9 in accordance with this Embodiment 1 can be a circuit that carries out the row arithmetic operation by faithfully following the flow chart of FIG. 4, or can be a circuit constructed of other means as long as its arithmetic operations are equivalent to those as mentioned above. As long as the same arithmetic operation results are provided, equivalent decoding performance can be provided.

As mentioned above, in accordance with this Embodiment 1, because the row arithmetic operation is carried out according to the procedure shown in FIG. 4 by using the circuit structure as shown in FIG. 7, the row arithmetic operation approximate (i.e., closely analogous) to that based on the Sum-Product decoding method can be implemented with a high degree of precision, and the decoding performance of decoding an error correcting code can be improved. Furthermore, as compared with a decoding device based on the Offset BP-based decoding method, the decoding device in accordance with this embodiment provides the nearly same amount of arithmetic operations which is only slightly larger than that of the Offset BP-based decoding method by an amount corresponding to one-time comparison, the decoding device can be implemented to have a circuit scale equivalent to the small circuit scale of the decoding device based on the Offset BP-based decoding method. Therefore, as compared with the Sum-Product decoding method, the amount of arithmetic operations can be reduced remarkably, and the circuit scale of the decoding device can be also reduced.

Although the processes succeeding step ST2a are divided into the two cases according to γ in above-mentioned Embodiment 1, the processes can be divided into three or more cases. That is, there can be provided a method of changing the offset according to the minimum of $|z_{r,c}|$, and subtracting the offset according to each of the cases from the minimum of $|z_{r,c}|$. Although the amount of arithmetic operations becomes large with increase in the number of cases into which the processes succeeding step ST2a are divided, the precision of the approximate calculation can be further improved and the decoding performance can be further improved.

Embodiment 2

The function g(x,δ) which is approximated in above-mentioned Embodiment 1 has x and δ as variables, as shown in the above-mentioned equation (11). In above-mentioned Embodiment 1, this function g(x,δ) is approximated in consideration of variations in the value of the variable x. However, as can be seen from the graph of FIG. 3 shown in above-mentioned Embodiment 1, the value of the function g(x,δ) changes largely under the influence of the variable δ in a region in which the variable x has a certain large value. In above-mentioned Embodiment 1, this variation is neglected and the offset β is approximated to be a constant value.

Therefore, in this Embodiment 2, a method of changing the offset according to the value of the variable δ will be mentioned. As a technology of changing the offset according to the variable δ, reference 1 discloses a δ-min decoding method, for example. (Reference 1) Rui Sakai, Wataru Matsumoto, and Hideo Yoshida, "Reduced Complexity Decoding Based on Approximation of Update Function for Low-Density Parity-Check Codes", The Transactions of the Institute of Electronics, Information and Communication Engineers. A, vol. J90-A, no. 2, pp. 83-91, February 2007.

Because the δ-min decoding method described in reference 1 neglects any variations in the function g(x,δ) due to the variable x, and determines the offset from the variable δ, the precision of the approximate calculation is low when the variable x has a value close to zero, as shown in the graph of FIG. 3. To solve this problem, in accordance with this Embodiment 2, when the value of x is smaller than γ, g(x,δ) is approximated to be 0, whereas when the value of x is equal to or larger than γ, an offset D(δ) for use in the δ-min decoding method is used. More specifically, an arithmetic operation is carried out according to the following equation (14).

$$x \otimes y = \begin{cases} \max\{\min\{x, y\} - D(\delta), 0\} & \text{if } \min\{x, y\} \geq \gamma \\ \min\{x, y\} & \text{if } \min\{x, y\} < \gamma \end{cases} \quad (14)$$

D(δ) is a function shown by the following equation (15). The variable δ is δ=y−x.

$$D(\delta) = \max\left\{0.9 - \frac{\delta}{2}, 0\right\} \quad (15)$$

As mentioned above, in accordance with this Embodiment 2, the dyadic operation according to the above-mentioned equation (4) is replaced by the operation in accordance with the above-mentioned equation (14), and g (x, δ) is approximated as mentioned above. Therefore, the precision of the approximate calculation can be further improved and the decoding performance can be further improved as compared with the case of carrying out the row arithmetic operation in accordance with above-mentioned Embodiment 1.

Embodiment 3

Figure 8:
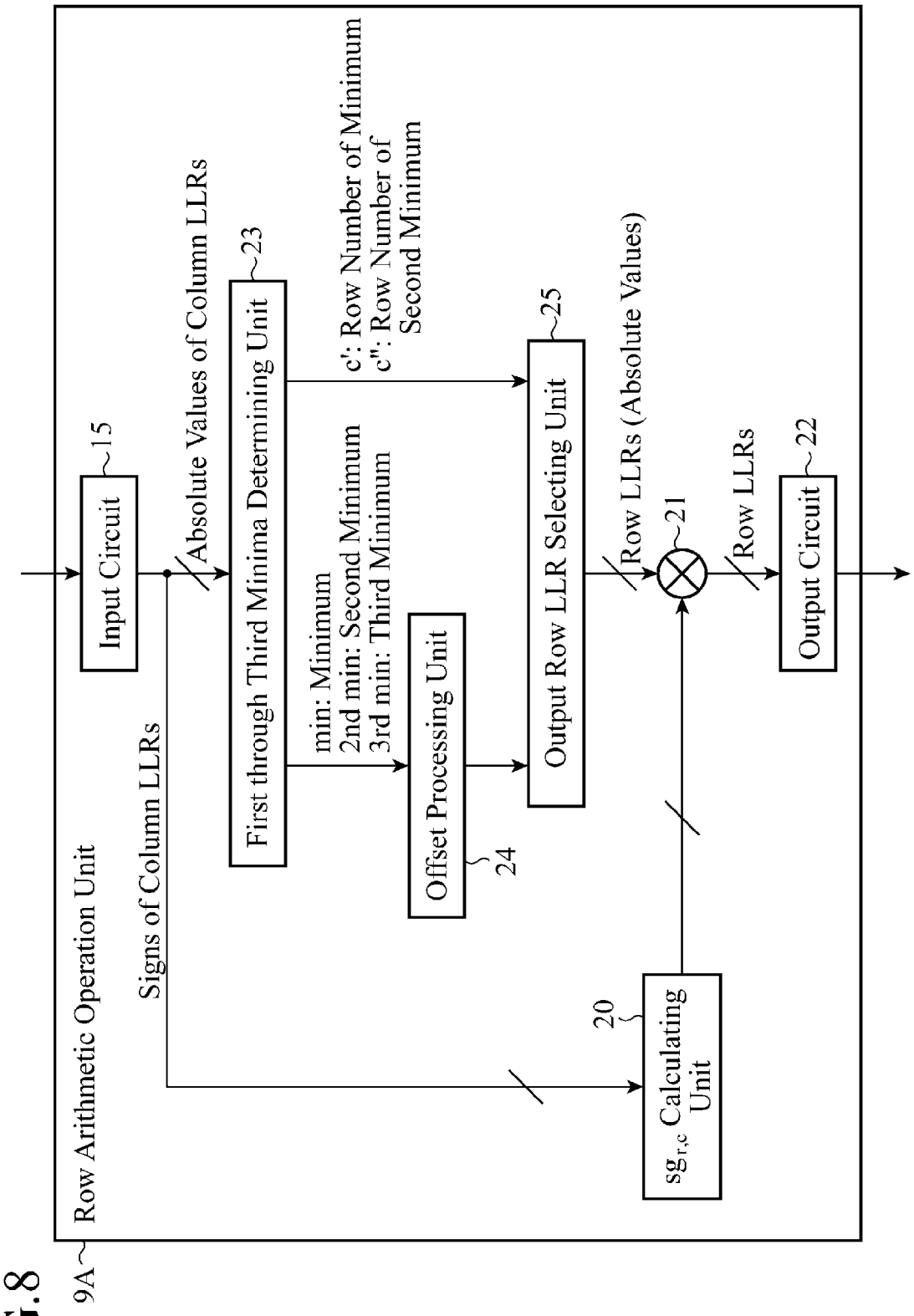
FIG. 8 is a block diagram showing the configuration of a row arithmetic operation unit in accordance with Embodiment 3 of the present invention.

In above-mentioned Embodiment 2, only the function g (x,δ) is approximated. In accordance with this Embodiment 3, the recursive operation of the row arithmetic operation (the arithmetic operation according to the above-mentioned equation (3)) is also approximated, like in the case of above-mentioned Embodiment 1. More specifically, the following equation (16) in which the offset β in the row arithmetic operation in accordance with above-mentioned Embodiment 1 (the arithmetic operation according to the above-mentioned equation (12)) is replaced by D(δ) in the above-mentioned Embodiment 2 is used.

$$\varepsilon_{r,c} = \begin{cases} sg_{r,c} \cdot \max\left\{\min_{c' \in N(r)\setminus\{c\}}\{|z_{r,c'}|\} - D(\delta), 0\right\} & \text{if } \min_{c' \in N(r)\setminus\{c\}}\{|z_{r,c'}|\} \geq \gamma \\ sg_{r,c} \cdot \min_{c' \in N(r)\setminus\{c\}}\{|z_{r,c'}|\} & \text{if } \min_{c' \in N(r)\setminus\{c\}}\{|z_{r,c'}|\} < \gamma \end{cases} \quad (16)$$

δ is the difference between the minimum of $|z_{r,c'}|$ and the second minimum of $|z_{r,c'}|$. By thus approximating the row arithmetic operation, the precision of the approximate calculation and decoding performance of the row arithmetic operation can be made to be higher than those of above-mentioned Embodiment 1, and the amount of arithmetic operations can be made to be smaller than that of above-mentioned Embodiment 2. FIG. 8 is a block diagram showing the configuration of a row arithmetic operation unit in accordance with Embodiment 3 of the present invention, and shows the inside of the already-explained row arithmetic operation unit shown in FIG. 6 in accordance with Embodiment 3. As shown in FIG. 8, the row arithmetic operation unit (a row calculating means) 9A in accordance with Embodiment 3 is provided with an input circuit 15, an $sg_{r,c}$ calculating unit 20, a multiplication circuit 21, an output circuit 22, a first through third minima determining unit 23, an offset processing unit 24, and an output row LLR selecting unit 25. Because the operations of the input circuit 15, the $sg_{r,c}$ calculating unit 20, the multiplication circuit 21, and the output circuit 22 are the same as those of above-mentioned Embodiment 1, a different portion will be explained hereafter.

The first through third minima determining unit 23 determines and outputs the minimum min of the absolute values of the column LLRs, the row number c' of the column LLR whose absolute value is the minimum, 2nd min which is the second minimum of the absolute values, the row number c" of the column LLR whose absolute value is the second minimum, and 3rd min which is the third minimum of the absolute values.

The offset processing unit 24 calculates an offset according to the above-mentioned equation (16) and carries out an offset process, while sending out the following three outputs. One of them is a min-offset-processed value which the offset processing unit calculates from the minimum min and the second minimum 2nd min. The offset processing unit outputs the minimum min when min is smaller than γ, whereas it outputs either min-D (δ) or 0 by setting δ=2nd min-min when min is equal to or larger than γ. The offset processing unit similarly sends out the two remaining outputs. More specifically, the offset processing unit calculates and outputs a min-offset-processed value from the minimum min and the third minimum 3rd min, and also calculates and outputs a 2nd-min-offset-processed value from the second minimum 2nd min and the third minimum 3rd min.

The output row LLR selecting unit 25 selects the 2nd-min-offset-processed value which the offset processing unit has calculated from the second minimum 2nd min and the third minimum 3rd min as the row LLR corresponding to the column c'. The output row LLR selecting unit 25 also selects the min-offset-processed value which the offset processing unit has calculated from the third minimum 3rd min and the minimum min as the row LLR corresponding to the column c", and selects the min-offset-processed value which the offset processing unit has calculated from the second minimum 2nd min and the minimum min as the row LLR corresponding to each of the other columns to output the selected min-offset-processed value.

As mentioned above, in accordance with this Embodiment 3, because the row arithmetic operation according to the above-mentioned equation (16) is carried out by using the circuit structure as shown in FIG. 8, the row arithmetic operation approximate (i.e., closely analogous) to that based on the Sum-Product decoding method can be implemented with a high degree of precision, and the decoding performance of decoding an error correcting code can be improved.

Embodiment 4

While above-mentioned Embodiment 3 provides high decoding performance, it is necessary to determine the minimum, the second minimum, and the third minimum and therefore the circuit scale becomes large. To solve this problem, in this Embodiment 4, a configuration of partially carrying out an offset process using δ which is the same as that shown in above-mentioned Embodiment 3 while determining the minimum and the second minimum in the same way as that shown in above-mentioned Embodiment 1 will be described.

Figure 9:
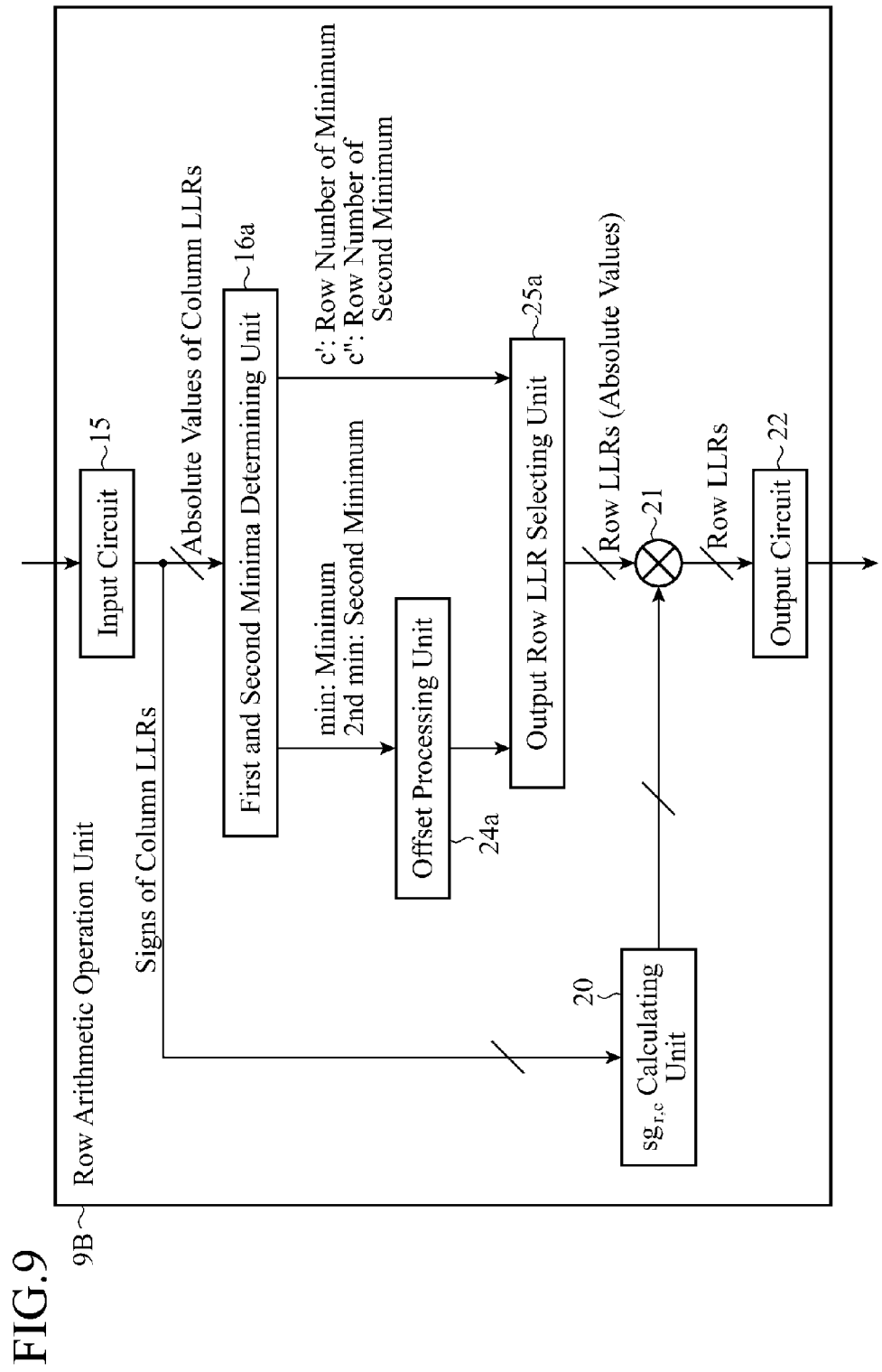
FIG. 9 is a block diagram showing the configuration of a row arithmetic operation unit in accordance with Embodiment 4 of the present invention.

FIG. 9 is a block diagram showing the configuration of a row arithmetic operation unit in accordance with Embodiment 4 of the present invention. As shown in FIG. 9, the row arithmetic operation unit (a row calculating means) 9B in accordance with Embodiment 4 is provided with an input circuit 15, an $sg_{r,c}$ calculating unit 20, a multiplication circuit 21, an output circuit 22, a first and second minima determining unit 16a, an offset processing unit 24a, and an output row LLR selecting unit 25a. The operations of the input circuit 15, the $sg_{r,c}$ calculating unit 20, the multiplication circuit 21, and the output circuit 22 are the same as those of above-mentioned Embodiments 1 and 3. The operation of the first and second minima determining unit 16a, the offset processing unit 24a, and the output row LLR selecting unit 25a differ from those of above-mentioned Embodiment 3.

The first and second minima determining unit 16a partially differs from the first and second minima determining unit 16 shown in above-mentioned Embodiment 1, and outputs the row number c" of the column LLR whose absolute value is the second minimum in addition to the minimum min, the row number c' of the column LLR whose absolute value is the minimum, and the second minimum 2nd min.

The offset processing unit 24a also sends out the following three outputs. A first one of them is a value (min−β) which the offset processing unit obtains by performing the same offset process as that of above-mentioned Embodiment 1 on the minimum min by using an offset set to a constant 13. A second one of them is a value (2nd min−β) which the offset processing unit obtains by similarly performing the same offset process as that of above-mentioned Embodiment 1 on the second minimum 2nd min by using an offset set to the constant β. A third output is a value (min−D (δ)) which the offset processing unit obtains by similarly performing the same offset process as that of above-mentioned Embodiment 3 by setting δ=2nd min−min and using an offset set to D(δ).

The output row LLR selecting unit 25a selects the 2nd-min-offset-processed value (2nd min−β) which the offset processing unit has obtained by performing the offset process on the second minimum 2nd min by using the offset β as the row LLR corresponding to the column c'. The output row LLR selecting unit 25a also selects the min-offset-processed value (min−β) which the offset processing unit has obtained by performing the offset process on the minimum min by using the offset β as the row LLR corresponding to the column c″, and selects the min-offset-processed value (min–D (δ)) which the offset processing unit has obtained by performing the offset process on the minimum min by using the offset D(δ) as the row LLR corresponding to each of the other columns to output the selected min-offset-processed value. The process carried out each of components placed downstream from the output row LLR selecting unit 25a is the same as that of above-mentioned Embodiment 1.

As mentioned above, in accordance with this Embodiment 4, because the above-mentioned row arithmetic operation is carried out by using the circuit structure as shown in FIG. 9, the precision of the approximate calculation for the columns other than the columns c′ and c″ can be improved and the decoding performance of decoding an error correcting code can be improved as compared with the row arithmetic operation in accordance with above-mentioned Embodiment 1. Furthermore, because the calculation of the first through third minima can be reduced to the calculation of the first and second minima, the circuit scale can be reduced as compared with that in accordance with above-mentioned Embodiment 3.

Many widely different embodiments of the present invention may be constructed without departing from the spirit and scope of the present invention. It should be understood that the present invention is not limited to the specific embodiments described in the specification, except as defined in the appended claims.

What is claimed is:

1. A decoding method of decoding a codeword encoded with an LDPC (Low-Density Parity-Check) code, comprising:
   calculating a LLR (Log-Likelihood Ratio) for each bit in a check matrix of said LDPC code; and
   performing an iterative process comprising:
      a) calculating row LLRs (Log-Likelihood Ratios) corresponding to a row weight of said check matrix of said LDPC code;
      b) calculating column LLRs corresponding to a column weight of said check matrix from said row LLRs calculated by a) in a current iteration;
      c) calculating an estimated bit sequence by estimating each bit on a basis of said column LLRs calculated by b) in the current iteration; and
      d) checking whether or not the estimated bit sequence calculated by c) in the current iteration is said codeword, and performing a next iteration of the process if the estimated bit sequence is not said codeword,
   wherein, in each iteration following an initial iteration of the process, a) includes:
      calculating a minimum of absolute values of the column LLRs, calculated by b) in a previous iteration, from columns c each having a value of 1 in a row which is one of targets of calculating the row LLRs;
      calculating a direct product with respect to the columns c by the following equation based on a Sum-Product decoding method:

$$sg_{r,c} = \prod_{c' \in N(r)\setminus\{c\}} \mathrm{sgn}(z_{r,c'}),$$

where $(Z_{r,c'})$ indicates the column LLR;

setting a value, as a row LLR of the current iteration, obtained by multiplying between said minimum and the direct product when said minimum is less than a prescribed constant;

determining whether a result value of subtracting an offset value β from said minimum is greater than zero when said minimum is equal to or greater than the prescribed constant, the offset value β being changed in accordance with said minimum;

setting a value, as a row LLR of the current iteration, obtained by multiplying between the result value of the subtraction and the direct product when a result of the determination indicates affirmation; and setting a value of zero as a row LLR of the current iteration when a result of the determination indicates negation.

2. The decoding method according to claim 1, wherein a) further includes:
   comparing a constant with a minimum of dyadic values which are a target for a dyadic operation executed in the row calculation using an algorithm based on the Sum-Product decoding method;
   recognizing the minimum of the dyadic values as a result of the dyadic operation when said minimum of the dyadic values is less than the constant; and
   recognizing, as a result of the dyadic operation, a result of subtracting an offset value D(δ) from the minimum of the dyadic values, the offset value D(δ) being acquired by the following equation:

$$D(\delta) = \max\left\{0.9 - \frac{\delta}{2}, 0\right\},$$

where the value δ is a variable indicating a difference between the dyadic values.

3. The decoding method according to claim 1, wherein the offset value β is an offset value D(δ) acquired by the following equation:

$$D(\delta) = \max\left\{0.9 - \frac{\delta}{2}, 0\right\},$$

where the value δ is a variable indicating a result value of subtracting the minimum of the absolute values of said column LLRs from a second minimum of the absolute values of said column LLRs.

4. The decoding method according to claim 1, wherein a) further includes:
   calculating a first value, a second value and a third value, where
      the first value indicates the result value of subtracting the offset value β from the minimum of absolute values of the column LLRs,
      the second value indicates a result value of subtracting the offset value β from a second minimum of absolute values of the column LLRs, and
      the third value indicates a result value of subtracting an offset value D(δ) as the offset value β from the minimum of absolute values of the column LLRs, the offset value D(δ) being acquired by the following equation:

$$D(\delta) = \max\left\{0.9 - \frac{\delta}{2}, 0\right\},$$

where the value δ is a variable indicating a result value of subtracting the minimum of absolute values of the column LLRs from the second minimum of absolute values of the column LLRs;
  comparing the second value with zero in the determination with respect to the column c having the minimum of absolute values of the column LLRs;
  comparing the first value with zero in the determination with respect to the column c having the second minimum of absolute values of the column LLRs; and
  comparing the third value with zero in the determination with respect to the other column c.

5. A decoding device for decoding a codeword encoded with an LDPC (Low-Density Parity-Check) code, comprising:
  an LLR calculating unit for calculating an LLR (Log-Likelihood Ratio) for each bit in a check matrix of said LDPC code;
  a combination of components configured to perform an iterative process, including:
    a row calculating unit for calculating row LLRs (Log-Likelihood Ratios) corresponding to a row weight of said check matrix of said LDPC code;
    a column calculating unit for calculating column LLRs corresponding to a column weight of said check matrix from said row LLRs calculated by said row calculating unit in a current iteration;
    a bit estimating unit for calculating an estimated bit sequence by estimating each bit on a basis of said column LLRs calculated by said column calculating unit in the current iteration; and
    a checking unit for checking whether or not the estimated bit sequence calculated by said bit estimating unit in the current iteration is said codeword, and causing a next iteration of the process to be performed if the estimated bit sequence is not said codeword,
  wherein, in each iteration following an initial iteration of the process, said row calculating unit:
    calculates a minimum of absolute values of the column LLRs, calculated by the column calculating unit in a previous iteration, from columns c each having a value of 1 in a row which is one of targets of calculating the row LLRs;
    calculates a direct product with respect to the columns c by the following equation based on a Sum-Product decoding method:

$$sg_{r,c} = \prod_{c' \in N(r)\setminus\{c\}} \mathrm{sgn}(z_{r,c'}),$$

where ($Z_{r,c'}$) indicates the column LLR;
    sets a value, as a row LLR of the current iteration, obtained by multiplying between said minimum and the direct product when said minimum is less than a prescribed constant;
    determines whether a result value of subtracting an offset value β from said minimum is greater than zero when said minimum is equal to or greater than the prescribed constant, the offset value β being changed in accordance with said minimum;
    sets a value, as a row LLR of the current iteration, obtained by multiplying between the result value of the subtraction and the direct product when a result of the determination indicates affirmation; and
    sets a value of zero as a row LLR of the current iteration when a result of the determination indicates negation.

6. The decoding device according to claim 5, wherein the row calculating unit is configured to further perform processes of:
  comparing a constant with a minimum of dyadic values which are a target for a dyadic operation executed in the row calculation using an algorithm based on the Sum-Product decoding method;
  recognizing the minimum of the dyadic values as a result of the dyadic operation when said minimum of the dyadic values is less than the constant; and
  recognizing, as a result of the dyadic operation, a result of subtracting an offset value D(δ) from the minimum of the dyadic values, the offset value D(δ) being acquired by the following equation:

$$D(\delta) = \max\left\{0.9 - \frac{\delta}{2}, 0\right\},$$

where the value δ is a variable indicating a difference between the dyadic values.

7. The decoding device according to claim 5 wherein the offset value β is an offset value D(δ) acquired by the following equation:

$$D(\delta) = \max\left\{0.9 - \frac{\delta}{2}, 0\right\},$$

where the value δ is a variable indicating a result value of subtracting the minimum of the absolute values of said column LLRs from a second minimum of the absolute values of said column LLRs.

8. The decoding device according to claim 5, wherein the row calculating unit is configured to further perform processes of:
  calculating a first value, a second value and a third value, where
    the first value indicates the result value of subtracting the offset value β from the minimum of absolute values of the column LLRs,
    the second value indicates a result value of subtracting the offset value β from a second minimum of absolute values of the column LLRs, and
    the third value indicates a result value of subtracting an offset value D(δ) as the offset value β from the minimum of absolute values of the column LLRs, the offset value D(δ) being acquired by the following equation:

$$D(\delta) = \max\left\{0.9 - \frac{\delta}{2}, 0\right\},$$

where the value δ is a variable indicating a result value of subtracting the minimum of absolute values of the column LLRs from the second minimum of absolute values of the column LLRs;

comparing the second value with zero in the determination with respect to the column c having the minimum of absolute values of the column LLRs;
comparing the first value with zero in the determination with respect to the column c having the second minimum of absolute values of the column LLRs; and
comparing the third value with zero in the determination with respect to the other column c.

* * * * *